United States Patent
Claramunt Blanco et al.

(10) Patent No.: US 11,646,514 B2
(45) Date of Patent: May 9, 2023

(54) SURFACE MOUNT TECHNOLOGY TERMINAL HEADER AND METHOD FOR PROVIDING AN ELECTRICAL CONNECTION TO A PRINTED CIRCUIT BOARD

(71) Applicant: Lear Corporation, Southfield, MI (US)

(72) Inventors: Jordi Claramunt Blanco, Valls (ES); Xavier Blas Morales, Valls (ES); Joan Ignasi Ferran Palau, Valls (ES); Adil Khan, Pune (IN)

(73) Assignee: LEAR CORPORATION, Southfield, MI (US)

( * ) Notice: Subject to any disclaimer, the term of this patent is extended or adjusted under 35 U.S.C. 154(b) by 169 days.

(21) Appl. No.: 16/989,490

(22) Filed: Aug. 10, 2020

(65) Prior Publication Data

US 2022/0045444 A1    Feb. 10, 2022

(51) Int. Cl.

| | |
|---|---|
| *H01R 12/00* | (2006.01) |
| *H01R 12/57* | (2011.01) |
| *H01R 12/71* | (2011.01) |
| *H05K 1/11* | (2006.01) |
| *H05K 1/18* | (2006.01) |

(52) U.S. Cl.
CPC ........... *H01R 12/57* (2013.01); *H01R 12/712* (2013.01); *H05K 1/111* (2013.01); *H05K 1/181* (2013.01)

(58) Field of Classification Search
CPC ...... H01R 12/57; H01R 12/712; H05K 1/111; H05K 1/181

USPC ........................................................ 439/83
See application file for complete search history.

(56) References Cited

U.S. PATENT DOCUMENTS

| | | | | |
|---|---|---|---|---|
| 3,097,032 A | * | 7/1963 | Hochheiser | H01R 12/523 439/246 |
| 3,218,606 A | * | 11/1965 | Schultz | H01R 12/718 439/82 |
| 3,270,251 A | * | 8/1966 | Evans | H01R 13/113 361/736 |
| 3,836,935 A | * | 9/1974 | Johnson | H01B 17/303 439/75 |

(Continued)

FOREIGN PATENT DOCUMENTS

| | | |
|---|---|---|
| CN | 1538559 A | 10/2004 |
| CN | 104218419 A | 12/2014 |

(Continued)

*Primary Examiner* — Abdullah A Riyami
*Assistant Examiner* — Vladimir Imas
(74) *Attorney, Agent, or Firm* — Brooks Kushman P.C.

(57) ABSTRACT

A surface mount technology (SMT) terminal header is described for providing an electrical connection to a first printed circuit board (PCB). The SMT terminal header includes multiple first electrically conductive connector elements each having a base configured for surface mount attachment to the first PCB, and an insulative housing having multiple cells and a fixation member configured to attach the housing to the first PCB. Each of the multiple cells is configured to at least partially house one of the multiple first electrically conductive connector elements. Each of the first electrically conductive connector elements includes a position assurance member configured to attach the first electrically conductive connector element to at least one of the multiple cells of the insulative housing.

20 Claims, 3 Drawing Sheets

(56) References Cited

U.S. PATENT DOCUMENTS

| | | | | |
|---|---|---|---|---|
| 3,932,934 | A * | 1/1976 | Lynch | H01R 43/0235 29/843 |
| 4,050,621 | A * | 9/1977 | Bouley | H01R 43/0235 228/180.1 |
| 4,662,691 | A * | 5/1987 | Derdzinski | H01R 12/52 439/74 |
| 4,663,815 | A * | 5/1987 | Hartman | H05K 3/3447 228/56.3 |
| 4,884,335 | A * | 12/1989 | McCoy | H05K 3/34 228/180.1 |
| 4,890,199 | A * | 12/1989 | Beutler | H04M 1/0202 361/736 |
| 5,131,853 | A | 7/1992 | Meyer | |
| 5,199,887 | A | 4/1993 | Iacono | |
| 5,218,760 | A | 6/1993 | Colton et al. | |
| 5,599,208 | A | 2/1997 | Ward | |
| 5,688,130 | A * | 11/1997 | Huang | H01R 12/716 439/541.5 |
| 5,704,752 | A | 1/1998 | Logerot | |
| 5,802,699 | A | 9/1998 | Fjelstad et al. | |
| 5,816,835 | A | 10/1998 | Meszaros | |
| 5,997,367 | A | 12/1999 | Nowak et al. | |
| 6,062,919 | A | 5/2000 | Trafton | |
| 6,067,236 | A * | 5/2000 | White | H02M 3/3374 363/16 |
| 6,206,728 | B1 | 3/2001 | Krehbiel et al. | |
| 6,413,119 | B1 | 7/2002 | Gabrisko, Jr. et al. | |
| 6,493,233 | B1 | 12/2002 | De Lorenzo et al. | |
| 6,783,376 | B2 | 8/2004 | Will et al. | |
| 6,790,051 | B1 * | 9/2004 | Secall | H05K 1/0256 174/541 |
| 6,799,980 | B2 | 10/2004 | Bloomfield et al. | |
| 6,824,403 | B2 | 11/2004 | Hall et al. | |
| 6,837,730 | B2 * | 1/2005 | Poh | H01R 13/6315 439/327 |
| 6,980,017 | B1 | 12/2005 | Farnworth et al. | |
| 7,044,755 | B2 | 5/2006 | Hatakeyama | |
| 7,149,089 | B2 | 12/2006 | Blasko et al. | |
| 7,297,026 | B2 | 11/2007 | Toda et al. | |
| 7,347,698 | B2 | 3/2008 | Dittmann | |
| 7,351,091 | B1 * | 4/2008 | Zhang | H01R 12/7011 439/459 |
| 7,354,276 | B2 | 4/2008 | Dittmann | |
| 7,361,055 | B2 | 4/2008 | Fuerst | |
| 7,364,442 | B2 | 4/2008 | Bang et al. | |
| 7,396,254 | B2 | 7/2008 | Harmelink et al. | |
| 7,510,407 | B1 | 3/2009 | Blasko et al. | |
| 7,581,965 | B1 | 9/2009 | Upasani et al. | |
| 7,943,859 | B2 | 5/2011 | Ambo et al. | |
| 7,976,319 | B2 * | 7/2011 | Nguyen | H01R 12/57 439/876 |
| 8,038,465 | B2 * | 10/2011 | Pavlovic | H05K 7/205 439/485 |
| 8,294,043 | B2 | 10/2012 | Munoz et al. | |
| 8,696,367 | B2 * | 4/2014 | Daughtry, Jr. | H01R 12/7076 439/83 |
| 8,790,122 | B2 * | 7/2014 | Malehorn, II | H01R 24/84 439/83 |
| 8,854,835 | B2 | 10/2014 | Feldstein et al. | |
| 8,979,452 | B2 | 3/2015 | Ikuno | |
| 9,167,698 | B2 * | 10/2015 | Konda | H05K 1/181 |
| 9,257,778 | B2 * | 2/2016 | Buck | H01R 13/6471 |
| 9,320,165 | B2 | 4/2016 | Gruber | |
| 9,437,974 | B2 | 9/2016 | Glick et al. | |
| 9,496,632 | B2 | 11/2016 | Schmalbuch et al. | |
| 9,543,703 | B2 * | 1/2017 | Horchler | H01R 13/05 |
| 9,680,247 | B1 | 6/2017 | Glick et al. | |
| 9,705,214 | B2 | 7/2017 | Tramet et al. | |
| 9,705,259 | B2 | 7/2017 | Feldner | |
| 9,711,876 | B2 | 7/2017 | Feye-Hohmann | |
| 9,711,926 | B2 | 7/2017 | Belanger, Jr. | |
| 9,774,117 | B1 | 9/2017 | Jackson et al. | |
| 9,873,392 | B2 | 1/2018 | Matsumura et al. | |
| 10,050,358 | B2 | 8/2018 | Muller et al. | |
| 10,122,044 | B2 | 11/2018 | De Souza et al. | |
| 10,348,029 | B2 | 7/2019 | Flender et al. | |
| 10,418,728 | B2 | 9/2019 | Fu et al. | |
| 10,573,983 | B2 | 2/2020 | Webber et al. | |
| 10,673,160 | B2 * | 6/2020 | Baier | H01R 12/58 |
| 10,707,598 | B2 * | 7/2020 | Fu | H01R 12/515 |
| 2003/0024734 | A1 | 2/2003 | Ineson et al. | |
| 2004/0209498 | A1 | 10/2004 | Hatakeyama | |
| 2010/0040431 | A1 | 2/2010 | Suzuki | |
| 2010/0112859 | A1 | 5/2010 | Olawsky et al. | |
| 2010/0311255 | A1 | 12/2010 | Reisinger et al. | |
| 2011/0059633 | A1 | 3/2011 | Chen et al. | |
| 2020/0112108 | A1 | 4/2020 | Yoshida et al. | |
| 2020/0136325 | A1 | 4/2020 | Yoshida et al. | |
| 2020/0176902 | A1 * | 6/2020 | Fu | H05K 1/181 |
| 2020/0370733 | A1 * | 11/2020 | Hatano | H05K 3/3431 |
| 2021/0313737 | A1 | 10/2021 | Scharnreithner et al. | |
| 2021/0399501 | A1 | 12/2021 | Balana Avila et al. | |
| 2022/0045444 | A1 * | 2/2022 | Claramunt Blanco | H05K 3/368 |

FOREIGN PATENT DOCUMENTS

| | | |
|---|---|---|
| CN | 105514626 A | 4/2016 |
| CN | 107069340 A | 8/2017 |
| EP | 1983811 A2 | 10/2008 |
| EP | 3001508 A1 | 3/2016 |
| FR | 3039329 A1 | 1/2017 |
| JP | H10189316 A | 10/2004 |

* cited by examiner

SURFACE MOUNT TECHNOLOGY TERMINAL HEADER AND METHOD FOR PROVIDING AN ELECTRICAL CONNECTION TO A PRINTED CIRCUIT BOARD

TECHNICAL FIELD

The following relates to a surface mount technology terminal header and method for providing an electrical connection to a printed circuit board.

BACKGROUND

Terminal headers may be used to provide electrical connections between multiple printed circuit boards (PCBs). Such inter-PCB connections may be used, for example, in an on-board charger (OBC) for an electric vehicle (EV) or hybrid electric vehicle (HEV) having high voltage (HV) power systems, such as 60 volts or greater, including for example 300 or 400 volts. Inter-PCB connections may also be used in any other applications or products having multiple PCBs, including those having HV power connections.

In that regard, surface mount technology (SMT) terminal headers may be used for such inter-PCB connections involving one or more Insulated Metal Substrate (IMS) PCBs. In an IMS PCB, one side may comprise an electrically conductive aluminum plate or substrate and the other an electrically non-conducive insulative layer, and no through hole technology (THT) components are possible. Available SMT terminal headers, however, have only signal terminals. As a result, two or more terminals are to be used for each power connection where high current flow between PCBs occurs. In that regard, some terminals cannot be used because safe distances therebetween in HV applications cannot be ensured. Moreover, the standard height for existing terminals results in large inter-PCB distances, thereby limiting the ability to reduce product volume. Still further, given the large number of terminals used in such applications, assembly or connection of PCBs by blind insertion of terminals on one PCB into cooperating terminals or connectors on another PCB is complex.

As a result, there exists a need for an improved SMT terminal header and method for providing an electrical connection to a PCB, such as for example inter-PCB connections in HV products, applications, or systems. Such an improved SMT terminal header and method for providing an electrical connection to a PCB would solve, eliminate, address, reduce, or mitigate the above-described issues associated with available SMT terminal headers.

SUMMARY

According to one non-limiting exemplary embodiment described herein, a surface mount technology (SMT) terminal header for providing an electrical connection to a first printed circuit board (PCB) is provided. The SMT terminal header comprises a plurality of first electrically conductive connector elements each having a base configured for surface mount attachment to the first PCB, and an insulative housing comprising a plurality of cells and a fixation member configured to attach the housing to the first PCB. Each of the plurality of cells is configured to at least partially house one of the plurality of first electrically conductive connector elements. Each of the first electrically conductive connector elements comprises a position assurance member configured to attach the first electrically conductive connector element to at least one of the plurality of cells of the insulative housing.

According to another non-limiting exemplary embodiment described herein, a surface mount technology (SMT) terminal header for providing an electrical connection to a first printed circuit board (PCB) is provided. The SMT terminal header comprises a plurality of first electrically conductive connector elements each configured for surface mount attachment to the first PCB, and an insulative housing comprising a plurality of cells and configured for attachment to the first PCB. Each of the plurality of cells is configured to at least partially house a single one of the plurality of first electrically conductive connector elements. Each of the first electrically conductive connector elements comprises a position assurance member configured to attach the first electrically conductive connector element to at least one of the plurality of cells of the insulative housing.

According to yet another non-limiting exemplary embodiment described herein, surface mount technology (SMT) method for providing an electrical connection to a first printed circuit board (PCB) via a terminal header is provided, the terminal header comprising (i) a plurality of first electrically conductive connector elements, each of the plurality of first electrically conductive connector elements including a position assurance member and a base and (ii) an insulative housing including a plurality of cells and a fixation member. The method comprises attaching the position assurance member of each of the plurality of first electrically conductive connector elements to a portion of one of the plurality of cells of the insulative housing. The method further comprises attaching the fixation member of the insulative housing to the first PCB after attaching the position assurance member of each of the plurality of first electrically conductive connector elements to a portion of one of the plurality of cells of the insulative housing. The method still further comprises attaching the base of each of the plurality of first electrically conductive connector elements to the first PCB by SMT after attaching the fixation member of the insulative housing to the first PCB.

A detailed description of these and other non-limiting exemplary embodiments of a SMT terminal header and method for providing an electrical connection for a printed circuit board is set forth below together with the accompanying drawings.

DETAILED DESCRIPTION

Figure 1:
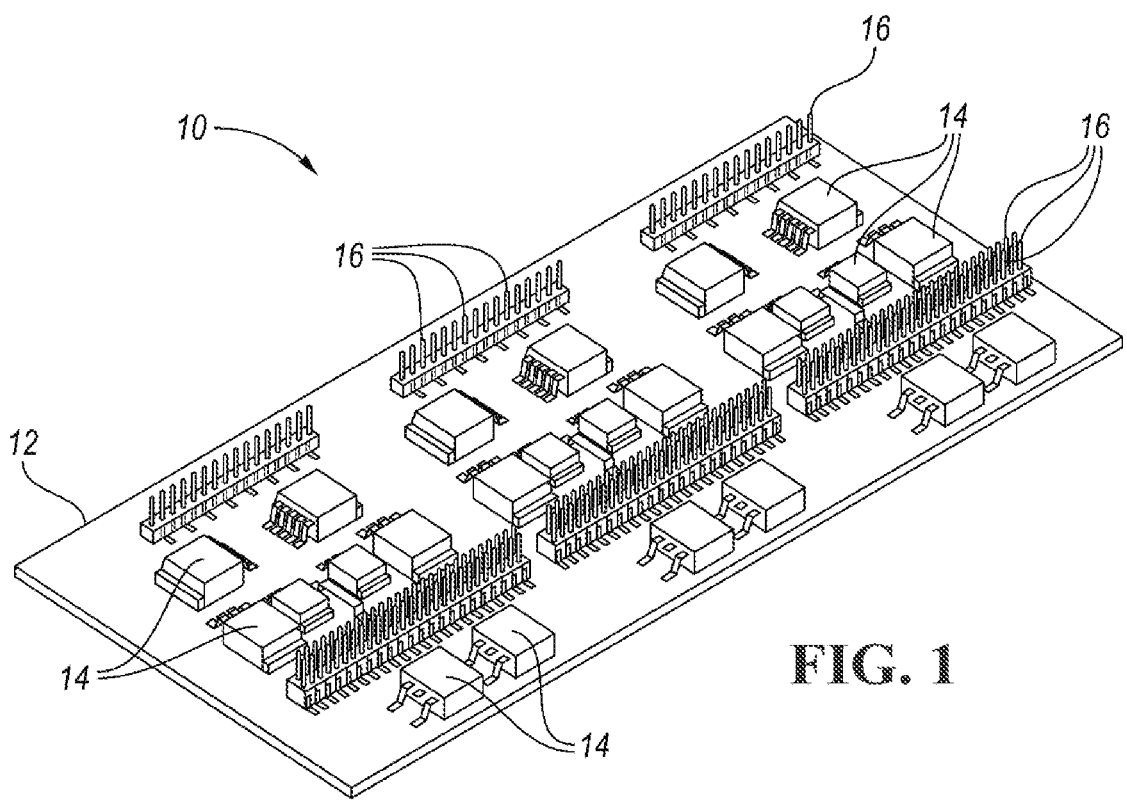
FIG. 1 is a perspective view of a printed circuit board (PCB) configured for connection to another PCB.

As required, detailed non-limiting embodiments are disclosed herein. However, it is to be understood that the disclosed embodiments are merely exemplary and may take various and alternative forms. The figures are not necessarily to scale, and features may be exaggerated or minimized to show details of particular components, elements, features, items, members, parts, portions, or the like. Therefore, specific structural and functional details disclosed herein are not to be interpreted as limiting in any way, but merely as a representative basis for teaching one skilled in the art.

With reference to the Figures, a more detailed description of non-limiting exemplary embodiments of a surface mount technology (SMT) terminal header and SMT method for providing an electrical connection to a printed circuit board (PCB) will be provided. For ease of illustration and to facilitate understanding, like reference numerals may be used herein for like components and features throughout the drawings, but reference numerals are not to be interpreted as limiting in any way.

As previously described, terminal headers may be used to provide inter-PCB electrical connections such as, for example, in an OBC for an EV or HEV having HV power systems. SMT terminal headers may be used for inter-PCB connections involving one or more IMS PCBs with which no THT components are possible. However, available SMT terminal headers have only signal terminals. Two or more terminals are therefore used for each power connection where high current flow between PCBs occurs, and some terminals cannot be used because safe distances therebetween in HV applications cannot be ensured. The standard height for existing terminals also results in large inter-PCB distances, thereby limiting the ability to reduce product volume. Given the large number of terminals used in such applications, assembly or connection of PCBs by blind insertion of terminals on one PCB into cooperating terminals or connectors on another PCB is also complex. As a result, there exists a need for an improved SMT terminal header and method for providing an electrical connection to a PCB, such as for example inter-PCB connections in HV products, applications, or systems.

Referring now to FIG. 1, a perspective view is shown of an assembly 10 including a PCB 12 configured for connection to another PCB (not shown). In that regard, the PCB 12 may comprise an insulated metal substrate (IMS) PCB, and may have any number or type of electrical or electronic components 14 attached or mounted to a surface thereof or integrated therein, including electrically conductive lines, vias, traces, pads, islands, or the like (not shown). Such components 14 may be surface mount technology (SMT) components or surface mount or surface mounted devices and may be attached or mounted to a surface of the PCB 12 by solder.

The PCB 12 may also have any number of terminals 16 attached or mounted to a surface thereof. Such terminals 16, which may take the forms of pins as shown in FIG. 1, may be configured to cooperate with electrically conductive connector elements, such as female receptacles (not shown) attached to a surface of another PCB (not shown). In that regard, insertion of the terminal pins 16 into such cooperating female connectors (not shown) attached to such other PCB (not shown) creates, establishes, or provides an inter-PCB electrical connection between the PCB 12 and such other PCB (not shown). As is readily apparent, such an assembly 10, including PCB 12 and terminals 16, suffers from the issues associated with available terminal headers previously described herein.

Figure 2:
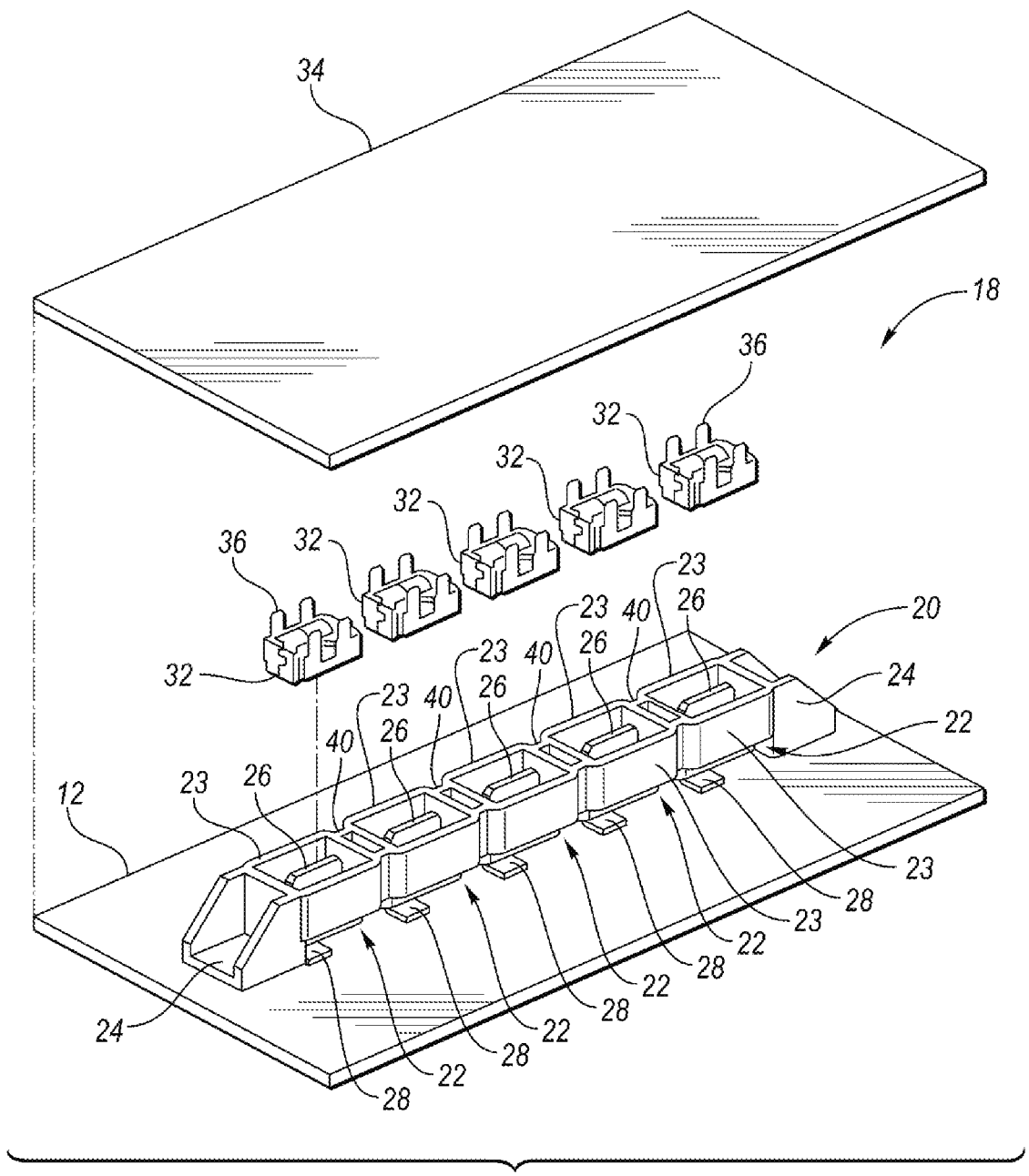
FIG. 2 is a partially exploded perspective view of a surface mount technology (SMT) terminal header for providing an electrical connection to a printed circuit board (PCB) according to one non-limiting exemplary embodiment of the present disclosure.

Referring now to FIG. 2, a partially exploded perspective view of a SMT terminal header 18 for providing an electrical connection to a PCB 12 according to one non-limiting exemplary embodiment of the present disclosure is shown. In that regard, PCB 12 may again comprise an IMS PCB, and may have any number or type of electrical or electronic components (not shown) attached or mounted to a surface thereof or integrated therein, including electrically conductive lines, vias, traces, pads, islands, or the like (not shown).

As seen in FIG. 2, the terminal header 18 may comprise an insulative housing 20, which may for example comprise a plastic material. The housing 20 may comprise a plurality of cells 22 as well as one or more fixation members 24. Each of the fixation members 24 may be configured to attach or for attachment of the housing 20 to the PCB 12. The terminal header 18 may further comprise a plurality of first electrically conductive connector elements, such as terminals 26.

Figure 3:
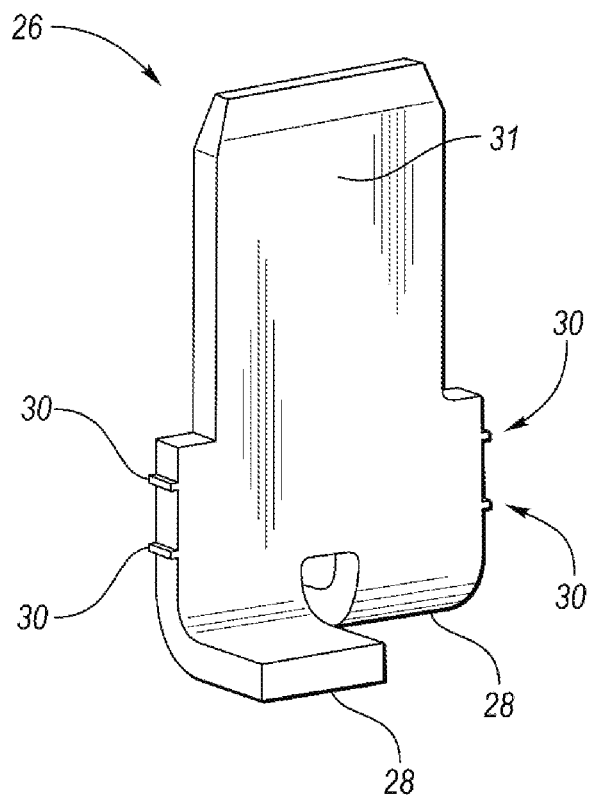
FIG. 3 is a perspective view of an exemplary non-limiting electrically conductive connector element for use in a surface mount technology (SMT) terminal header for providing an electrical connection to a printed circuit board (PCB) according to one non-limiting exemplary embodiment of the present disclosure.

In that regard, FIG. 3 shows a perspective view of an exemplary non-limiting electrically conductive connector element 26 for use in a SMT terminal header 18 for providing an electrical connection to a PCB 12 according to one non-limiting exemplary embodiment of the present disclosure. As seen therein, and with continuing reference to FIG. 2, each terminal 26 may comprise a base 28, which may be configured to attach to a surface or for surface mounted attachment of the terminal 26 to the PCB 12, such as by soldering. In that regard, the fixation members 24 provide, allow, or enable initial fixation of the terminal header assembly 18 in place on the PCB 12, before soldering of the terminals 26 to the PCB 12.

Still referring to FIGS. 2 and 3, each of the plurality of cells 22 may be configured to at least partially house one of the plurality of first electrically conductive connector elements, such as terminals 26. Each of the first electrically conductive connector elements 26 may comprise one or more position assurance members, such as nails 30, which may be configured to attach or for attachment of the first electrically conductive connector element 26 to at least one of the plurality of cells 22 of the insulative housing 20. As previously noted, the PCB 12 may comprise an IMS and, in that regard, the base 28 of each of the plurality of first electrically conductive connector elements 26 may be configured for surface mount technology (SMT) attachment or mounting to the PCB 12, such as by soldering, as only SMT components may be used with an IMS PCB 12.

Figure 4:
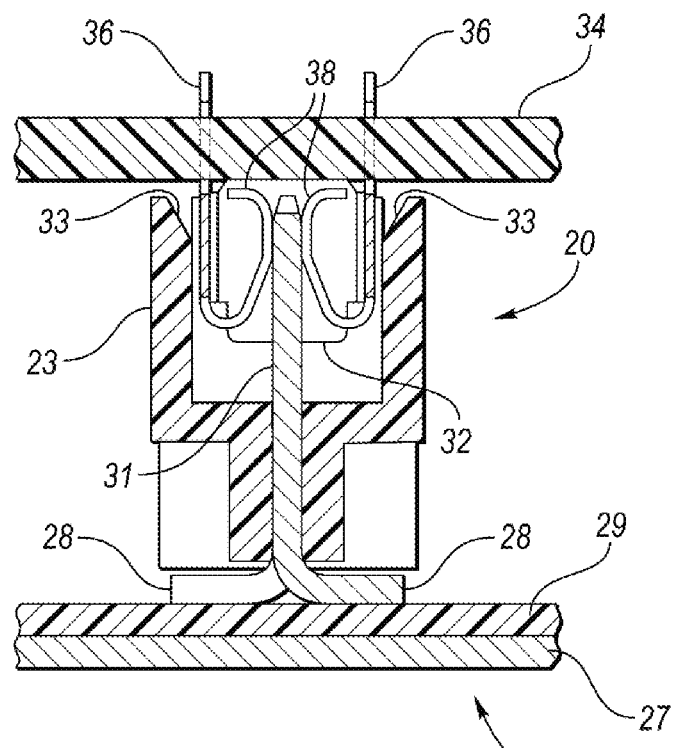
FIG. 4 is a cross-sectional view of a surface mount technology (SMT) terminal header for providing an electrical connection to a printed circuit board (PCB) according to one non-limiting exemplary embodiment of the present disclosure.

FIG. 4 shows a cross-sectional view of a terminal header 18 including insulative housing 20 for providing an electrical connection to a PCB 12 according to one non-limiting exemplary embodiment of the present disclosure. As seen therein, and with continuing reference to FIGS. 2 and 3, each of the plurality of cells 22 of the insulative housing 20 may comprise a frame 23, which may be configured to at least partially surround a single one of the plurality of first electrically conductive connector elements 26.

Moreover, the position assurance member 30 of each of the plurality of first electrically conductive connector elements 26 may comprises one or more nails to be driven or nailed into the frame 23 of one of the plurality of cells 22 of the insulative housing 20. In that regard, when driven or nailed into the frame of the plurality of cells 22, nails 30 of the terminals 26 assure proper position of the terminals 26.

Still further, tabs or blades 31 of the terminals 26 may be provided with a reduced height relative to that of the terminal pins 16 shown in FIG. 1. More specifically, terminal pins 16 may have a height of 12.5 millimeters, whereas the tabs or blades 31 of terminals 26 may be provided with a height of 11 millimeters, providing for a height reduction of 1.5 millimeters or 12%. Such a height reduction reduces inter-PCB connection distances and facilitates volume reduction for any product in which the terminal header 18 may be employed or utilized. It should be noted, however, that the terminals 26 may be provided with any appropriate height, such as between 11 and 13 millimeters, or any alternative appropriate height outside that range.

As previously described in connection with FIG. 2 and as also seen in FIG. 4, each terminal 26 may comprise a base 28, which may be configured to attach or for attachment of the terminal 26 to the PCB 12. Once again, the PCB 12 may comprise an IMS, which may comprise an electrically conductive metal layer 27, such as aluminum, and an electrically non-conductive insulative layer 29.

As seen in FIGS. 2 and 4, each of the plurality of first electrically conductive connector elements 26 may be configured to cooperate with a second electrically conductive connector element 32. Each second electrically conductive connector element 32 may be attached or configured for attachment to another PCB 34. As a result, an electrical connection between the PCB 12 and the PCB 34 may be provided, created, or established by connecting the first electrically conductive connector elements 26 to the second electrically conductive connector elements 32.

More specifically, as best seen in FIG. 4, the second electrically conductive connector elements 32 may comprise or be provided with press-fit features 36, which may be configured to attach the second electrically conductive connector elements 32 to the PCB 34 by insertion into electrically conductive vias (not shown) formed in the PCB 34. Alternatively, the second electrically conductive connector elements 32 may be attached to the PCB 34 in any other known fashion, such as for example surface mounting with solder.

Still referring to FIGS. 2-4, as previously described, each of the plurality of first electrically conductive connector elements 26 may comprise a tab or blade 31. Each of the second electrically conductive connector elements 32 may be configured to receive the tab or blade 31 of one of the plurality of first electrically conductive connector elements 26. As best seen in FIG. 4, the tab or blade 31 of a first electrically conductive connector element 26 may be inserted into or received by a second electrically conductive connector element 32. In that regard, the second electrically conductive connector element 32 may be provided with resilient or flexible features 38 which may be configured to maintain physical contact with the tab or blade 31 to thereby provide an electrical connection between the first electrically conductive connector element 26 and the second electrically conductive connector element 32.

Moreover, each of the plurality of cells 24 of the insulative housing 20, including frames 23, may be configured to receive and align one of the second electrically conductive connector elements 32 with one of the plurality of first electrically conductive connector elements 26. In that regard, the frame 23 of the housing 20 may be shaped so that the openings of the cells 24 facing the second electrically conductive connector elements 32 are wider at the top or the end receiving the electrically conductive connector elements 32. For example, the frames 23 at the openings of the cells 24 facing the second electrically conductive connector elements 32 may be provided with one or more chamfered inner ends, edges, or surfaces 33 to help in initial (blind) alignment of the electrically conductive connector elements 32 with the tab or blade 31 of the electrically conductive connector elements 26.

Each of the plurality of first electrically conductive connector elements 26 may be configured for operation in a HV application, product, or system, such as one having an operating voltage of 60 volts or greater, including for example 300 or 400 volts. In that regard, the tabs or power blades 31 of electrically conductive connector elements 26 enable or allow for high currents. Moreover, the insulative housing 20, including cells 22 and frames 23, facilitates blind connection of the second electrically conductive connector elements 32 to the first electrically conductive connector elements 26.

The insulative housing 20, including cells 22 and frames 23, also assures inter-connection safe distances (clearance and creepage) in high voltage signals. In that regard, as seen in FIG. 2, one or more of the plurality of cells 22 of the insulative housing 20 may be provided with spacers 40 to control or provide for sufficient inter-connection distances between the terminals 26.

The terminal header 18 of the present disclosure may also be modular in nature to enable different numbers and/or configurations of terminals 26. In that regard, each of the plurality of cells 22 of the insulative housing 20 may be a separate module and may be attached to another one of the plurality of cells 22 to provide the insulative housing 20 with any number of cells 22 and any selected one of a plurality of configurations, as desired or needed for a particular product, application, or system design or manufacture.

With reference again to FIGS. 2-4, a surface mount technology (SMT) method for providing an electrical connection to a PCB 12 via a terminal header 18 is also described. As previously noted, the terminal header 18 may comprising a plurality of first electrically conductive connector elements 26, each of which may include a position assurance member 30 and a base 28. The terminal header 18 may also comprise an insulative housing 20 including a plurality of cells 22 and a fixation member 24.

The method of the present disclosure may comprise attaching the position assurance member 30 of each of the plurality of first electrically conductive connector elements 26 to a portion of one of the plurality of cells 22 of the insulative housing 20. The method may further comprise attaching the fixation member 24 of the insulative housing 20 to the PCB 12 after attaching the position assurance member 30 of each of the plurality of first electrically conductive connector elements 26 to a portion of one of the plurality of cells 22 of the insulative housing 20. The method may still further comprise attaching the base 28 of each of the plurality of first electrically conductive connector elements 26 to the PCB 12 by SMT after attaching the fixation member 24 of the insulative housing 20 to the first PCB 12.

As previously described, each of the plurality of cells 22 may comprise a frame 23, which may be configured to at least partially surround one of the plurality of first electrically conductive connector elements 26, and the position assurance member 30 of each of the plurality of first electrically conductive connector elements 26 may comprise a nail. Attaching the position assurance member 30 of each of the plurality of first electrically conductive connector elements 26 may comprise driving the nail 30 of each of the plurality of first electrically conductive connector elements 26 into the frame 23 of one of the plurality of cells 22 of the insulative housing 20. The PCB 12 may comprise an IMS and attaching the base 28 of each of the plurality of first electrically conductive connector elements 26 to the PCB 12 may comprise soldering the base 28 of each of the plurality of first electrically conductive connector elements 26 to a surface of the PCB 12 to mount each of the plurality of first electrically conductive connector elements 26 to the PCB 12.

As also previously described, each of the plurality of first electrically conductive connector elements 26 may be configured to cooperate with a second electrically conductive connector element 32 attached to another PCB 34. The method of the present disclosure may further comprise connecting each of the plurality of first electrically conductive connector elements 26 to a second electrically conductive connector element 32 to establish an electrical connection between the PCB 12 and the PCB 34. In that regard, connecting each of the plurality of first electrically conductive connector elements 26 with a second electrically conductive connector element 32 may comprise inserting each of the second electrically conductive connector elements 32 into one of the plurality of cells 22 of the insulative housing, wherein the plurality of cells 22 of the insulative housing 20, including the frames 23 thereof, align the second electrically conductive connector elements 32 with the plurality of first electrically conductive connector elements 26.

Moreover, each of the plurality of cells 22 of the insulative housing 20 may be an independent module. The method of the present disclosure may further comprise, before attaching the position assurance member 30 of each of the plurality of first electrically conductive connector elements 26 to a portion of one of the plurality of cells 22 of the insulative housing 20, attaching each of the plurality of cells 22 to another one of the plurality of cells 22 to provide the insulative housing 20 with a selected one of a plurality of configurations.

The present disclosure thus provides an improved SMT terminal header 18 and method for providing an electrical connection to a PCB, such as may be included in an OBC for a HV battery system in an EV or HEV. In that regard, the SMT attached power tabs or blades 26 of the SMT terminal header 18 of the present disclosure provide for precise inter-PCB HV power connections. The present disclosure thus provides an optimized inter-PCB SMT power tabs or terminal header 18. More specifically, the SMT terminal header 18 and SMT method for providing an electrical connection to a PCB according to the present disclosure may include power tabs 26 nailed to a plastic frame 23 to provide for tab or blade 26 position assurance. The SMT terminal header 18 and SMT method for providing an electrical connection to a PCB according to the present disclosure may also include terminals 26 having a shorter height, thereby providing for inter-PCB distance savings or reductions. The SMT terminal header 18 and SMT method for providing an electrical connection to a PCB according to the present disclosure may further include a plastic frame 23 at least partially surrounding the interface between connector elements 26, 32, thereby providing for connection assistance and assurance of safe HV distances. The SMT terminal header 18 and SMT method for providing an electrical connection to a PCB according to the present disclosure may also include an insulative housing 20 for terminals 26, the housing 20 having fixation members 24 for initial fixation of the housing 20 to the PCB 12, previous to soldering of the terminals 26 to the PCB 12. The SMT terminal header 18 and SMT method for providing an electrical connection to a PCB according to the present disclosure may also be adapted for modular design to enable different numbers and configurations of terminals 26 and resulting inter-PCB connections.

As is readily apparent from the foregoing, various non-limiting embodiments of a SMT terminal header and method for providing an electrical connection to a printed circuit board have been described. While various embodiments have been illustrated and described herein, they are exemplary only and it is not intended that these embodiments illustrate and describe all those possible. Instead, the words used herein are words of description rather than limitation, and it is understood that various changes may be made to these embodiments without departing from the spirit and scope of the following claims.

What is claimed is:

1. A surface mount technology (SMT) terminal header for providing an electrical connection to a first printed circuit board (PCB), the SMT terminal header comprising:
   a plurality of first electrically conductive connector elements each having a base configured for surface mount attachment to the first PCB; and
   an insulative housing comprising a plurality of cells and a fixation member configured to attach the insulative housing to the first PCB, wherein each of the plurality of cells is configured to at least partially house one of the plurality of first electrically conductive connector elements;
   wherein each of the plurality of first electrically conductive connector elements comprises a position assurance member attaching the first electrically conductive connector element to at least one of the plurality of cells of the insulative housing.

2. The terminal header of claim 1 wherein the first PCB comprises an insulated metal substrate.

3. The terminal header of claim 1 wherein each of the plurality of cells of the insulative housing comprises a frame configured to at least partially surround a single one of the plurality of first electrically conductive connector elements and wherein the position assurance member of each of the plurality of first electrically conductive connector elements comprises a nail that pierces into the frame of one of the plurality of cells of the insulative housing.

4. The terminal header of claim 1 wherein each of the plurality of first electrically conductive connector elements is configured to cooperate with a second electrically conductive connector element attached to a second printed circuit board (PCB) to establish an electrical connection between the first PCB and the second PCB.

5. The terminal header of claim 4 wherein each of the plurality of first electrically conductive connector elements comprises a tab and each of the second electrically conductive connector elements is configured to receive the tab of one of the plurality of first electrically conductive connector elements, and wherein each of the plurality of cells of the insulative housing is configured to receive and align one of the second electrically conductive connector elements with one of the plurality of first electrically conductive connector elements.

6. The terminal header of claim 1 wherein each of the plurality of first electrically conductive connector elements is configured for operation in a high-voltage system having an operating voltage of at least 60 volts.

7. The terminal header of claim 1 wherein each of the plurality of cells of the insulative housing is a separate module and is attached to another one of the plurality of cells to provide the insulative housing with a selected one of a plurality of configurations.

8. An on-board charger (OBC) for a vehicle, the OBC comprising the terminal header of claim 1.

9. A surface mount technology (SMT) terminal header for providing an electrical connection to a first printed circuit board (PCB), the SMT terminal header comprising:
  a plurality of first electrically conductive connector elements each configured for surface mount attachment to the first PCB; and
  an insulative housing comprising a plurality of cells and configured for attachment to the first PCB, wherein each of the plurality of cells is configured to at least partially house a single one of the plurality of first electrically conductive connector elements;
  wherein each of the plurality of first electrically conductive connector elements comprises a position assurance member attaching the first electrically conductive connector element to at least one of the plurality of cells of the insulative housing.

10. The terminal header of claim 9 wherein the first PCB comprises an insulated metal substrate and each of the plurality of first electrically conductive connector elements comprises a base configured for surface-mount attachment to the first PCB.

11. The terminal header of claim 9 wherein each of the plurality of cells of the insulative housing comprises a frame configured to at least partially surround one of the plurality of first electrically conductive connector elements and wherein each position assurance member of the plurality of first electrically conductive connector members comprises a nail that pierces into the frame of one of the plurality of cells of the insulative housing.

12. The terminal header of claim 9 wherein each of the plurality of first electrically conductive connector elements is configured to cooperate with a second electrically conductive connector element attached to a second printed circuit board (PCB) and wherein each of the plurality of cells of the insulative housing is configured to receive and align one of the second electrically conductive connector elements with one of the plurality of first electrically conductive connector elements to establish an electrical connection between the first PCB and the second PCB.

13. The terminal header of claim 9 wherein each of the plurality of cells of the insulative housing is a separate module and is attached to another one of the plurality of cells to provide the insulative housing with a selected one of a plurality of configurations.

14. An on-board charger (OBC) for a vehicle, the OBC comprising the terminal header of claim 9.

15. A surface mount technology (SMT) method for providing an electrical connection to a first printed circuit board (PCB) via a terminal header comprising (i) a plurality of first electrically conductive connector elements, each of the plurality of first electrically conductive connector elements including a position assurance member and a base and (ii) an insulative housing including a plurality of cells and a fixation member, the method comprising:
  attaching the position assurance member of each of the plurality of first electrically conductive connector elements to a portion of one of the plurality of cells of the insulative housing;
  attaching the fixation member of the insulative housing to the first PCB after attaching the position assurance member of each of the plurality of first electrically conductive connector elements to a portion of one of the plurality of cells of the insulative housing; and
  attaching the base of each of the plurality of first electrically conductive connector elements to the first PCB by SMT after attaching the fixation member of the insulative housing to the first PCB.

16. The method of claim 15 wherein each of the plurality of cells comprises a frame configured to at least partially surround one of the plurality of first electrically conductive connector elements, the position assurance member of each of the plurality of first electrically conductive connector elements comprises a nail, and attaching the position assurance member of each of the plurality of first electrically conductive connector elements comprises the nail of each of the plurality of first electrically conductive connector elements piercing into the frame of one of the plurality of cells of the insulative housing.

17. The method of claim 15 wherein the first PCB comprises an insulated metal substrate and attaching the base of each of the plurality of first electrically conductive connector elements to the first PCB comprises soldering the base of each of the plurality of first electrically conductive connector elements to a surface of the first PCB to mount each of the plurality of first electrically conductive connector elements to the PCB.

18. The method of claim 15 wherein each of the plurality of first electrically conductive connector elements is configured to cooperate with a second electrically conductive connector element attached to a second printed circuit board (PCB) and the method further comprises connecting each of the plurality of first electrically conductive connector elements to a second electrically conductive connector element to establish an electrical connection between the first PCB and the second PCB.

19. The method of claim 18 wherein connecting each of the plurality of first electrically conductive connector elements with a second electrically conductive connector element comprises inserting each of the second electrically conductive connector elements into one of the plurality of cells of the insulative housing, wherein the plurality of cells of the insulative housing align the second electrically conductive connector elements with the plurality of first electrically conductive connector elements.

20. The method of claim 15 wherein each of the plurality of cells of the insulative housing is an independent module and the method further comprises, before attaching the position assurance member of each of the plurality of first electrically conductive connector elements to a portion of one of the plurality of cells of the insulative housing, attaching each of the plurality of cells to another one of the plurality of cells to provide the insulative housing with a selected one of a plurality of configurations.

* * * * *